US009781831B2

(12) United States Patent
Hao (10) Patent No.: US 9,781,831 B2
(45) Date of Patent: Oct. 3, 2017

(54) ELECTRONIC DEVICE INCLUDING MODULE ACCOMMODATING COMPONENTS DISPOSED ON SUBSTRATE

(71) Applicant: NEC Corporation, Tokyo (JP)

(72) Inventor: Wenda Hao, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/666,376

(22) Filed: Mar. 24, 2015

(65) Prior Publication Data

US 2015/0282320 A1 Oct. 1, 2015

(30) Foreign Application Priority Data

Mar. 27, 2014 (JP) ................. 2014-066425

(51) Int. Cl.
| | | |
|---|---|---|
| *H01M 10/48* | (2006.01) | |
| *H05K 1/14* | (2006.01) | |
| *H05K 7/14* | (2006.01) | |
| *H05K 3/36* | (2006.01) | |

(52) U.S. Cl.
CPC ........... *H05K 1/141* (2013.01); *H05K 7/1485* (2013.01); *H05K 7/1487* (2013.01); *H05K 3/366* (2013.01); *H05K 2201/044* (2013.01); *H05K 2201/048* (2013.01); *H05K 2201/09063* (2013.01); *H05K 2201/09081* (2013.01); *H05K 2201/09127* (2013.01)

(58) Field of Classification Search
CPC ..................................... H01R 23/68
USPC .................................... 361/679.21
See application file for complete search history.

(56) References Cited

U.S. PATENT DOCUMENTS 5,017,146 A * 5/1991 Uehara ................. H01R 23/68
439/60

FOREIGN PATENT DOCUMENTS

| JP | 62-128691 U | 8/1987 |
|---|---|---|
| JP | 62-170646 A | 10/1987 |
| JP | 63-182574 U | 11/1988 |
| JP | 01-060572 U | 4/1989 |
| JP | 02-263495 A | 10/1990 |
| JP | 06-017293 U | 3/1994 |

(Continued)

OTHER PUBLICATIONS

Japanese Decision of Rejection in Application No. JP 2014-066425 dated Sep. 15, 2015 with a partial English translation thereof.

(Continued)

*Primary Examiner* — Jerry Wu
(74) *Attorney, Agent, or Firm* — McGinn IP Law Group, PLLC.

(57) ABSTRACT

An electronic device includes a substrate having a connector formed on a main face, and a module having a terminal detachably connected to the connector of the substrate. The module includes an extended part which projects below the terminal in an installation direction. The substrate includes a bypass part which bypasses the extended part when the module is connected to the substrate. The bypass part is a cutout or a recess formed in the substrate. The extended part accommodates a plurality of components aligned in the installation direction. The extended part is extended from the lower end of the module by a difference between a first size, corresponding to multiple times the size of each component, and a second size ranging from the upper end of the module to the end of the terminal.

14 Claims, 4 Drawing Sheets

(56) References Cited

FOREIGN PATENT DOCUMENTS

| | | |
|---|---|---|
| JP | 06-120636 A | 4/1994 |
| JP | 11-312854 A | 11/1999 |
| JP | 2004-140114 A1 | 5/2004 |
| JP | 2004-281908 A | 10/2004 |
| JP | 2004-281909 A | 10/2004 |
| JP | 2005-026388 A | 1/2005 |
| JP | 2008-181837 A | 8/2008 |
| JP | 2009-135194 A | 6/2009 |
| JP | 2009-188138 A | 8/2009 |

OTHER PUBLICATIONS

Japanese Office Action dated Feb. 3, 2015.
Japanese Office Action dated Nov. 10, 2016, with a partial English translation thereof.
Japanese Office Action dated Oct. 11, 2016, with a partial English translation thereof.

\* cited by examiner

ELECTRONIC DEVICE INCLUDING MODULE ACCOMMODATING COMPONENTS DISPOSED ON SUBSTRATE

BACKGROUND OF THE INVENTION

Field of the Invention

The present invention relates to a mounting structure of a module perpendicularly disposed on a substrate for use in an electronic device.

The present application claims priority on Japanese Patent Application No. 2014-66425, the entire content of which is incorporated herein by reference.

Description of the Related Art

Recently, electronic devices have been designed such that manufacturers could easily add functions or delete functions by connecting modules to substrates via connectors or by extracting modules from substrates. For example, it is possible to employ various types of modules equipped with a CPU, memory, hard drives, network cards, etc. It is preferable that electronic devices be further reduced in size or further increased in density of integrating components.

Patent Literature Document 1 discloses an erroneous mount preventing structure for a sub-board on a main board. A sub-board is perpendicularly attached to an elongated hole formed in a main board by use of cutouts formed in the elongated hole of a main board at positions corresponding to chips of a sub-board. Patent Literature Document 2 discloses an electronic circuit device, in which two pairs of electronic circuits are each formed by mounting electronic components on an insulating substrate. It aims to reduce the size of a case encapsulating an electronic circuit device by combining insulating substrates such that electronic components formed on one insulating substrate can be partially engaged with through-cutouts formed in the other insulating substrate. Patent Literature Document 3 discloses an erroneous insertion preventing structure for a mid-plane substrate. Patent Literature Document 4 discloses a mounting structure of a child substrate perpendicularly disposed on a parent substrate. It aims to reduce a redundant space for mounting connectors such that a child substrate can be engaged with cutouts formed in a parent substrate.

The foregoing electronic devices suffer from drawbacks in that the height of a module perpendicularly disposed on a substrate should be limited due to the size of the housing. In particular, it is difficult to secure an adequate height for a mounting face of a module when a plurality of components is aligned in a height direction and mounted on a module connected to a substrate via a connector. Patent Literature Documents 1, 2, and 4 disclose technologies which cannot be applied to a module perpendicularly disposed on a substrate via a connector. Thus, it is difficult to secure an adequate height for a mounting face of a module by use of those technologies.

To cope with drawbacks due to an inadequate height for a mounting face of a module, it is necessary to increase the number of modules disposed on a substrate or to increase the height of a module as much as possible. However, this may increase the size of an electronic device.

CITATION LIST

Patent Literature Document

Patent Literature Document 1: Japanese Utility-Model Application Publication No. H1-60572

Patent Literature Document 2: Japanese Utility-Model Application Publication No. S62-128691

Patent Literature Document 3: Japanese Patent Application Publication No. 2008-181837

Patent Literature Document 4: Japanese Patent Application Publication No. 2009-188138

SUMMARY OF THE INVENTION

The present invention is created in consideration of the aforementioned circumstances. The present invention aims to improve a mounting structure of a module perpendicularly disposed on a substrate for use in an electronic device, thus efficiently using a space in a direction of mounting a module on a substrate, securing an adequate space for mounting components on a module, improving the degree of freedom in layouts of components, and further increasing the density of integrating components.

In a first aspect of the invention, an electronic device includes a substrate having a connector formed on a main face, and a module having a terminal detachably connected to the connector of the substrate. The module includes an extended part which is shaped to project below the terminal in an installation direction. The substrate includes a bypass part which bypasses the extended part when the module is connected to the substrate.

In a second aspect of the invention, an electronic device includes a substrate having a plurality of connectors aligned on a main face, and a module having a plurality of terminals detachably connected to a plurality of connectors of the substrate. The module includes an extended part which is formed between the terminals so as to project below the terminals in an installation direction. The substrate includes a bypass part which is formed between the connectors so as to bypass the extended part when the module is connected to the substrate.

In a third aspect of the invention, a server includes a housing keeping the above electronic device.

In a fourth aspect of the invention, a substrate combined with a module having a terminal and an extended part includes a connector formed on a main face and detachably connected to the terminal of the module, and a bypass part forming a cutout or a recess in the substrate so as to bypass the extended part of the module.

In a fifth aspect of the invention, a module combined with a substrate having a connector includes a terminal detachably connected to the connector of the substrate, and an extended part projecting below the terminal.

According to the present invention, it is possible for the electronic device to efficiently use the space of the module in the installation direction. It is possible to secure the space of mounting components on the module. It is possible to improve the degree of freedom in layouts of components on the module. It is possible to improve density of integrating modules on the module by means of the extended part.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENT

The present invention will be described in detail by way of various embodiments with reference to the accompanying drawings.

1. First Embodiment

Figure 1:
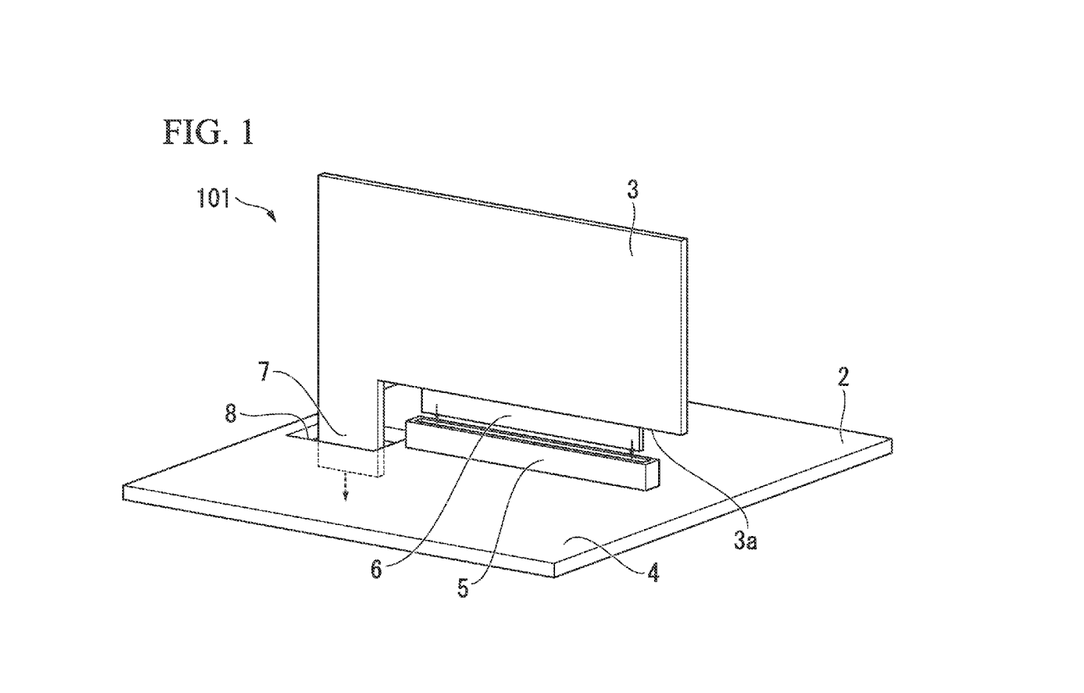
FIG. 1 is a perspective view showing a mounting structure of a module perpendicularly disposed on a substrate for use in an electronic device according to the first embodiment of the present invention.

FIG. 1 is a perspective view showing a mounting structure of a module perpendicularly disposed on a substrate for use in an electronic device according to the first embodiment of the present invention. An electronic device 101 includes a substrate 2 and a module 3. The substrate 2 may serve as a printed circuit board (PCB). The substrate 2 is kept inside the housing (not shown) of an electronic device 101.

The substrate 2 is equipped with a connector 5 via which the module 3 is connected to a main face 4. The connector 5 is fixed onto the main face 4 of the substrate 2. The connector 5 includes a plurality of electrodes (not shown) to be electrically connected to the module 3. The connector 5 mechanically supports the module 3 electrically connected to the connector 5 such that the module 3 is disposed in a perpendicular direction to the main face 4 of the substrate 2.

The module 3 includes a terminal 6 to be connected to the connector 5. The terminal 6 projects downwardly from a lower end 3a of the module 3 positioned close to the connector 5. The module 3 further includes an extended part 7 which is extended downwardly below the terminal 6 in an installation direction.

The substrate 2 includes a bypass part 8 by which the extended part 7 of the module 3 may not interfere with the substrate 2. Even when the extended part 7 is extended downwardly below the main face 4 of the substrate 2 in the installation direction, it is possible to prevent the extended part 7 from interfering with the engagement of the terminal 6 connected to the connector 5. Additionally, the bypass part 8 is formed not to interfere with various components mounted on the extended part 7. In other words, the present embodiment may allow for any components mounted on the extended part 7 of the module 3.

FIG. 1 shows that the bypass part 8 is formed by cutting out a part of the substrate 2; but this is not a restriction. It is possible to employ any structures for the bypass part 8 as long as they do not interfere with the terminal 6 extended downwardly in the installation direction; that is, the bypass part 8 is not necessarily limited to a cutout running through the substrate 2. For example, it is possible to determine the length of the extended part 7 extended from the lower end 3a of the module 3 in the installation direction based on the thickness of the substrate 2 and the distance between the back of the substrate 2 and the housing.

An installation method of components according to the present embodiment will be described below. First, the extended part 7 extended downwardly below the terminal 6 in the installation direction is formed in the module 3 equipped with the terminal 6 to be connected to the connector 5 of the substrate 2. Additionally, the bypass part 8 is formed in the substrate 2 so as to interfere with any contact with the extended part 7. At least part of components is formed mounted on the extended part 7 of the module 3.

According to the first embodiment, it is possible to enlarge the mount area of the module 3 on which various components can be mounted by means of the extended part 7 which is extended below the terminal 6 in the installation direction. Thus, it is possible to enlarge the mount space of the module 3 in which various components can be mounted without increasing the height between the connector 5 and the lower end 3a of the module 3. As a result, it is possible to improve the degree of freedom in terms of layouts of components mounted on the module 3, and it is possible to increase density of components or circuits installed in the electronic device 101.

2. Second Embodiment

Figure 2:
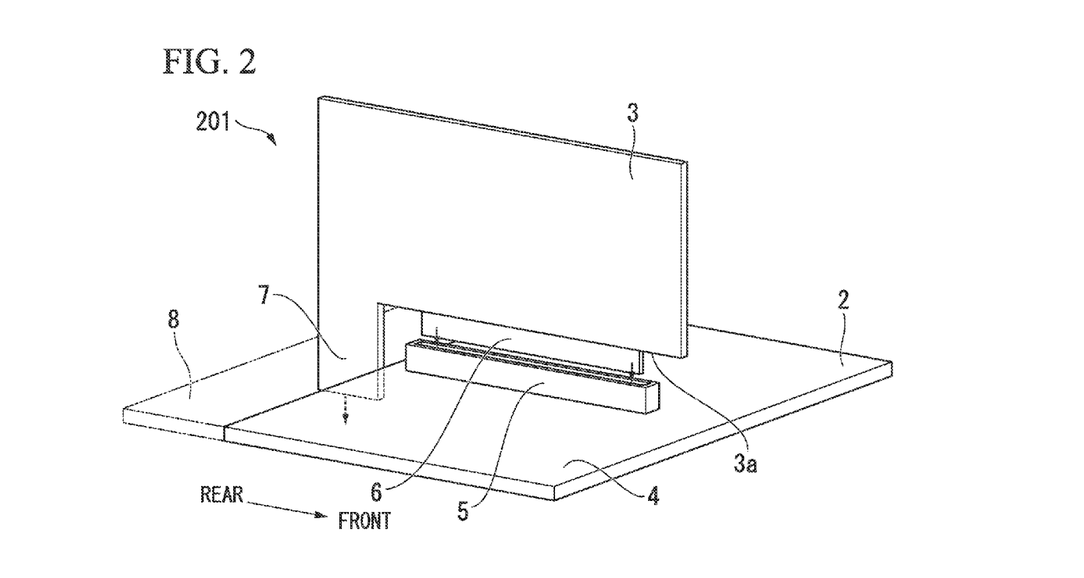
FIG. 2 is a perspective view showing a mounting structure of a module perpendicularly disposed on a substrate for use in an electronic device according to the second embodiment of the present invention.

Next, a mounting structure of a module perpendicularly disposed on a substrate according to the second embodiment of the present invention will be described with reference to FIG. 2. FIG. 2 shows an electronic device 201 which is optimized in terms of the positioning of the module 3 in the electronic device 101; hence, parts identical to those shown in FIG. 1 will be specified using the same reference signs; thus, duplicate descriptions thereof will be omitted.

As shown in FIG. 2, the electronic device 201 includes the substrate 2 and the module 3. The module 3 shown in FIG. 2 has the same structure as the module 3 shown in FIG. 1. The module 3 includes the terminal 6 to be connected to the connector 5 of the substrate 2. The terminal 6 projects downwardly from the lower end 3a of the module 3. The module 3 includes the extended part 7 which is extended below the terminal 6 in the installation direction.

The substrate 2 includes the connector 5 via which the module 3 can be connected to the main face 4. The connector 5 is fixed onto the main face 4. The connector 5 includes a plurality of electrodes (not shown) to be electrically connected to the module 3. The connector 5 mechanically supports the module 3 such that the module 3 electrically connected to the connector 5 is perpendicularly disposed on the main face 4 of the substrate 2. The connector 5 is elongated in the lengthwise direction of the substrate 2 (see "Rear" and "Front" in FIG. 2). The connector 5 is disposed close to the rear end of the substrate 2.

The substrate 2 includes the bypass part 8 which prevents the extended part 7 of the module 3 from interfering with the substrate 2. The bypass part 8 is formed in the rear end of the substrate 2. Even when the extended part 7 is extended below the main face 4 of the substrate 2 in the installation direction, it is possible to prevent the extended part from interfering with the engagement between the connector 5 and the terminal 6 of the module 3 by means of the bypass part 8.

Similar to FIG. 1, FIG. 2 shows that the bypass 8 is formed by cutting out part of the substrate 2; but this is not a restriction. It is possible to employ any structures for the bypass part 8 as long as they do not interfere with a further extension of the terminal 6 in the installation direction. FIG. 2 shows the bypass part 8 formed in the rear end of the substrate 2; but this is not a restriction. It is possible to form the bypass part 8 in the front end of the substrate 2 while disposing the connector 5 in the front end of the substrate 2. Alternatively, it is possible to form a pair of bypass parts 8 in the front end and the rear end of the substrate 2 while disposing a pair of connectors 5 in the front end and the rear end of the substrate 2. FIG. 2 shows that the bypass part 2 is formed in the entirety of the rear end of the substrate 2; but this is not a restriction. It is possible to form the bypass part 8 in the rear end of the substrate as necessary.

According to the second embodiment, it is possible to utilize the extended part 7 as a space of mounting a communication component such as a connector. When the extended part 7 serves as a space of mounting a communication component such as a connector, it is possible for an operator to easily pull out a cable from the extended part 7 positioned close to the rear end of the substrate 2. Additionally, it is possible to align a plurality of communication connectors in the height direction of the module 3 by use of the extended part 7 although communication connectors are relatively large components which may be hardly mounted on the module 3.

3. Third Embodiment

Next, a mounting structure of a module perpendicularly disposed on a substrate for use in an electronic device according to the third embodiment of the present invention will be described with reference to FIG. 3.

Figure 3:
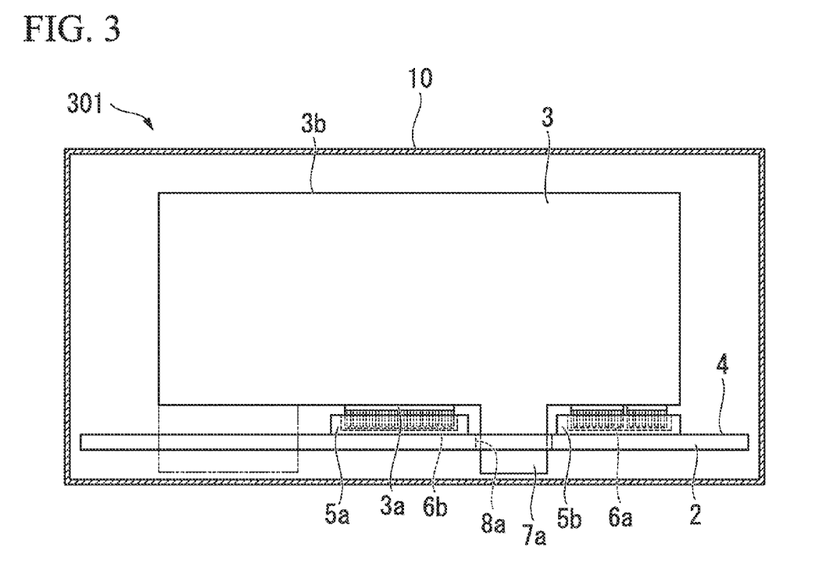
FIG. 3 is a side view partly in section showing a mounting structure of a module perpendicularly disposed on a substrate for use in an electronic device according to the third embodiment of the present invention.

FIG. 3 shows an electronic device 301 which differs from the electronic device 101 in terms of the number of connectors 5 and the number of terminals 6; hence, parts identical to those shown in FIG. 1 will be specified using the same reference signs; thus, duplicate descriptions thereof will be omitted.

As shown in FIG. 3, the electronic device 301 includes the substrate 2 and the module 3. A plurality of connectors 5a and 5b is formed on the main face 4 of the substrate 2. Both the connectors 5a and 5b are connected to a single module 3. The connectors 5a and 5b are distanced from each other in the lengthwise direction of the substrate 2. A bypass part 8a is formed at the predetermined position interposed between the connectors 5a and 5b so as to prevent an extended part 7a of the module 3 from interfering with the substrate 2. The bypass part 8a is a through-hole which is formed by cutting out part of the substrate 2.

The module 3 includes a plurality of terminals 6a and 6b to be connected to the connectors 5a and 5b. The terminals 6a and 6b project downwardly from the lower end 3a of the module 3 at the counterpart positions corresponding to the connectors 5a and 5b. The extended part 7a is extended from the lower end 3a of the module 3 in the installation direction at the predetermined position interposed between the terminals 6a and 6b.

The substrate 2 and the module 3 are kept inside a housing 10. The housing 10 may be stored in a rack (not shown) having the predetermined size (e.g. 19 inches in length). The height of the housing 10 is formed in the regular size defined as 1U, 2U, or 3U. In the present embodiment, the substrate is laid along the base of the housing 10 having a rectangular parallelepiped shape. For the purpose of insulation, a predetermined gap is interposed between the substrate 2 and the base of the housing 10 via legs (not shown). The module 3 is installed in the housing 10 with a predetermined gap interposed between the top face of the housing 10 and an upper end 3b opposite to the lower end 3a of the module 3 in the insertion/extraction direction.

According to the third embodiment in which a single module 3 includes a plurality of terminals 6a and 6b to be detachably connected to a plurality of connectors 5a and 5b, it is possible to secure an additional space, on which additional components such as chips can be mounted, between the terminals 6a and 6b. Thus, it is possible to further increase density of integrating components in the electronic device 3.

FIG. 3 shows the electronic device 301 including a pair of connectors 5a and 5b and a pair of terminals 6a and 6b; but this is not a restriction. The third embodiment needs a plurality of connectors and a plurality of terminals, but the number of connectors and the number of terminals are not necessarily limited to two. For example, when the electronic device 301 includes n combinations of connectors and terminals (where n is an integer larger than two), it is possible to maximally form "n−1" extended parts 7a with the module 3. Additionally, it is possible to modify the electronic device 301 to include the extended part 7 and the bypass part 8 in addition to the extended part 7a and the bypass part 8a.

4. Fourth Embodiment

Figure 4:
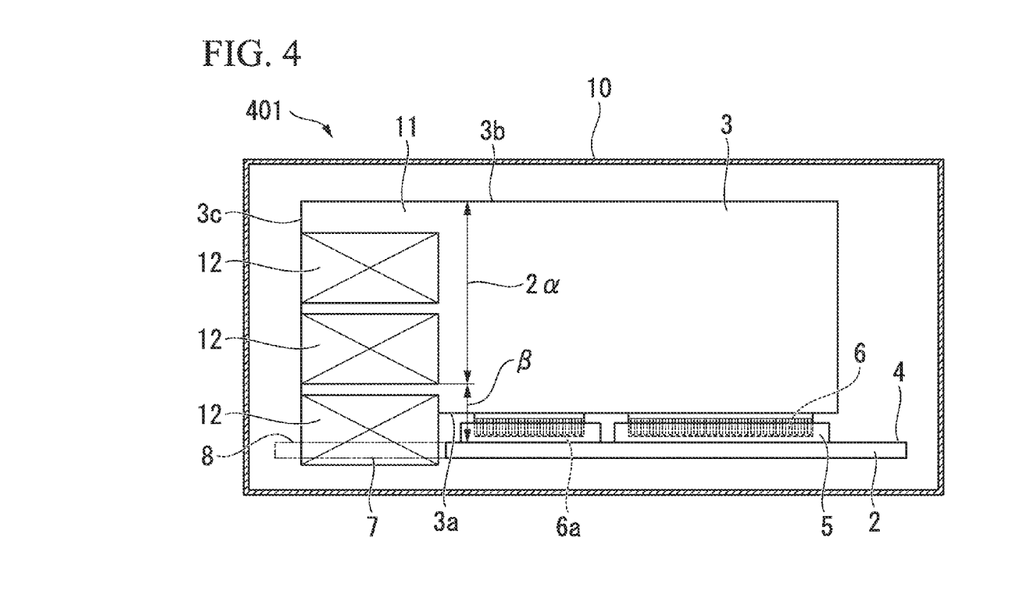
FIG. 4 is a side view partly in section showing a mounting structure of a module perpendicularly disposed on a substrate for use in an electronic device according to the fourth embodiment of the present invention.

Next, a mounting structure of a module perpendicularly disposed on a substrate according to the fourth embodiment of the present invention will be descried with reference to FIG. 4.

FIG. 4 shows an electronic device 401 which is optimized in terms of the size of the extended part 7 of the module 3 in the electronic device 101; hence, parts identical to those shown in FIG. 1 will be specified using the same reference signs; thus, duplicate descriptions thereof will be omitted.

Similar to the electronic device 101, the electronic device 401 includes the substrate 2 and the module 3. The substrate 2 includes the connector 5, which projects from the main face 4, and the bypass part 8. The module 3 includes the extended part 7 positioned oppositely to the bypass part 8 of the substrate 2.

The module 3 includes a plurality of components 12 mounted on a mount face 11. For example, the components 12 are communication connectors for use in LANs. The components 12 are aligned outside the terminal 6 in the lengthwise direction of the substrate 2. A plurality of components 12 is aligned in the installation direction of the module 3. Due to the limited installation space, the components 12 are tightly aligned without any gaps. The components 12 have opening of connectors directing outwardly from the module 3.

The module 3 includes the extended part 7 which is extended below the terminal 6 in the installation direction. The extended size of the extended part 7 may be identical to a difference between the size of the module 3, ranging from the upper end 3b to an end 6a of the terminal 6 in the installation/extraction direction, and multiple times the size of each of the components 12 aligned in the installation direction on the module 3.

In the present embodiment, the module 3 has at least a space of mounting two components 12 which ranges from the upper end 3b to the end 6a of the terminal 6 in the installation direction. For example, the above space ranging from the upper end 3b of the module 3 to the end 6a of the terminal 6 includes an upper space having a size "2α" accommodating two components 12 and a lower space having a size "β" which is smaller than the size of one component 12 (where α>β). To mount three components 12 on the module 3, it is necessary to further extend the extended part 7 by a difference between "2α+β" to "3α". In this case, the size of the space ranging from the upper end 3b of the module 3 to the end 6a of the terminal should be smaller than multiple times the size of each component 12 in the installation direction.

According to the fourth embodiment, it is possible to mount and alight n+1 components 12 on the module 3 by means of the extended part 7 even when the size of the space ranging from the upper end 3b of the module 3 to the end 6a of the terminal 6 in the installation direction is limited to n times the size of each component 12. As a result, it is possible for the fourth embodiment to align n+1 components 12 on the module 3 without any waste.

5. Fifth Embodiment

Next, a mounting structure of a module perpendicularly disposed on a substrate for use in an electronic device according to the fifth embodiment will be described with reference to FIG. 5.

Figure 5:
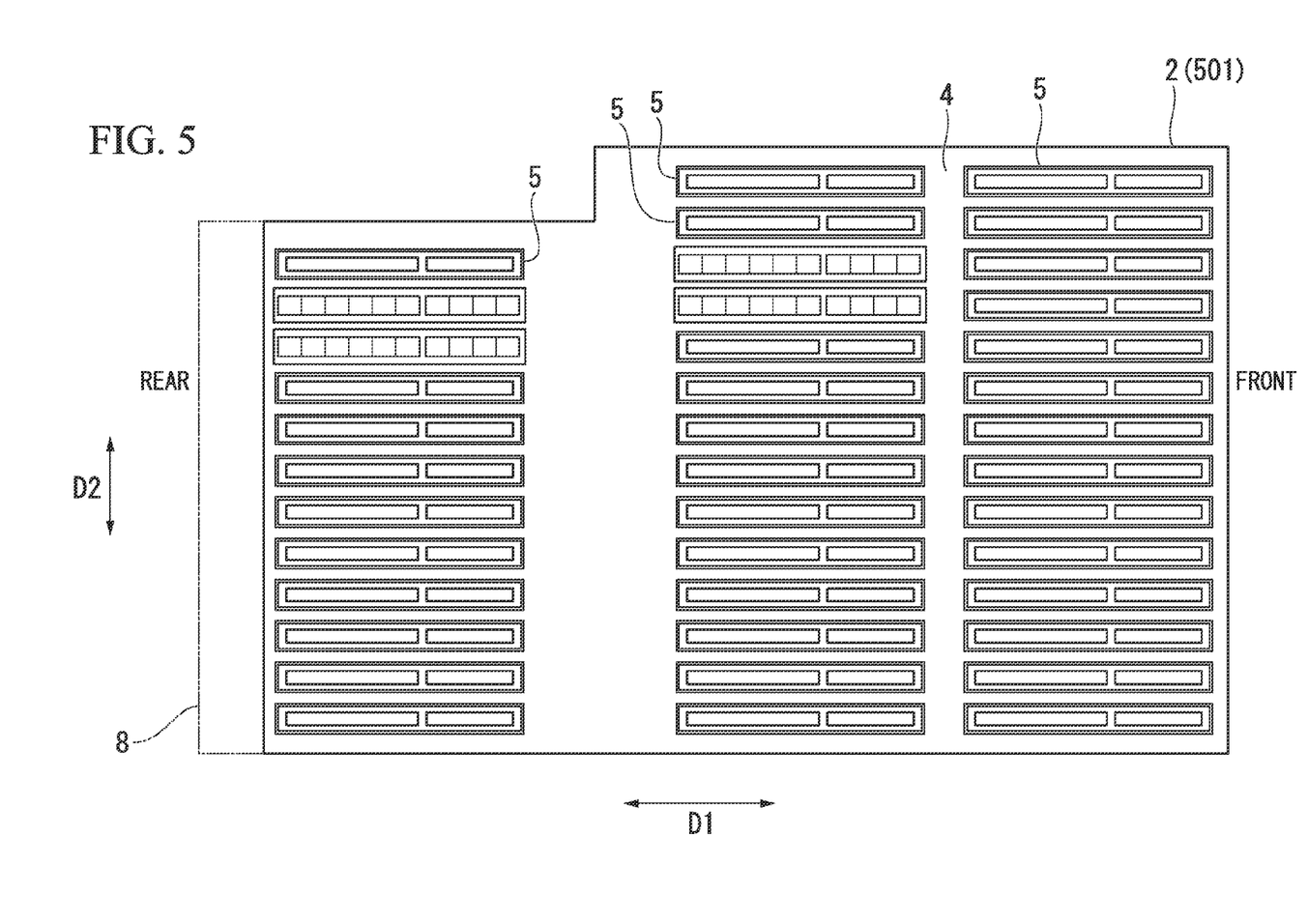
FIG. 5 is a plan view partly in section showing a mounting structure of a module perpendicularly disposed on a substrate for use in an electronic device according to the fifth embodiment of the present invention.

FIG. 5 is a plan view of an electronic device 501 of the fifth embodiment which differs from the electronic device 101 of the first embodiment in terms of a complex-type high-density server accommodating a plurality of server units. In FIG. 5, parts identical to those shown in FIG. 1 will be specified using the same reference signs; hence, duplicate descriptions thereof will be omitted.

As shown in FIG. 5, the electronic device 501 includes the substrate 2 and the module 3 (not shown). The electronic device 401 serves as a high-density server accommodating a plurality of server units.

The module 3 includes hardware and programs achieving various functions. The electronic device 5 may include various types of modules 3 having different functions. Specifically, the modules 3 may include at least a module 3 having a communication function for use in a LAN. The substrate 2 is defined using a lengthwise direction D1 between "Rear" and "Front" and a crosswise direction D2 along "Rear". The module 3 having a communication function can be detachably connected to the connector 5 disposed in the rear side (see "Rear") in the lengthwise direction D1. Herein, PCI-Express extension connector may serve as the connector 5 to be connected with the module 3 having a communication function.

The module 3 having a communication function is identical to the module 3 of the fourth embodiment; hence, a plurality of components 12 can be mounted on the module 3. The fifth embodiment may use LAN-communication connectors as the components 12 mounted on the module 3. A plurality of components 12 is aligned in the installation direction with the connector 5.

Due to the limited space, it is necessary to align the components 12 without any gaps. The opening of each communication connector corresponding to each component 12 is directed outwardly in the opposite side of the terminal 6 in the lengthwise direction D1. The fifth embodiment refers to communication connectors as the components 12 mounted on the module 3. Additionally, it is possible to mount various types of electronic components such as communication control chips (not shown), other than communication connectors, on the mount face 11 of the module 3.

A plurality of connectors 5 is aligned on the substrate 2 in the lengthwise direction D1. The connectors 5 are aligned with gaps in the lengthwise direction D1. Specifically, three rows of connectors 5 are formed on the substrate 2 in the lengthwise direction D1; but the number of rows of connectors 5 is not necessarily limited to three.

In the fifth embodiment, each server unit is formed using a combination of multiple types of modules 3 to be connected to the connectors 5 on the substrate 2. Other than the modules 3 having communication functions, it is possible to employ modules 3 having operational functions such as CPUs, modules 3 having storage functions such as hard drives or flash memory, etc.

The bypass part 8 is formed in the rear end of the substrate 2 in the lengthwise direction D1 so as to bypass the extended part 7 of the module 3. In the fifth embodiment, the bypass part 8 is a cutout disposed adjacent to the connector 5. The bypass part 8 is formed continuously along the entirety of the rear end of the substrate 2 in the crosswise direction D2.

The fifth embodiment refers to the modules 3 having communication functions to be connected to the connectors 5 aligned in the rear side of the substrate 2 in the lengthwise direction D1; but this is not a restriction. It is possible to modify the fifth embodiment such that the modules 3 having communication functions can be detachably connected to the connectors 5 aligned in the center of the substrate 2 and the connectors 5 aligned in the front side of the substrate 2 in the lengthwise direction D1. In this case, it is necessary to form the bypass parts 8 in proximity to the connectors 5 aligned in the center of the substrate 2 and the connectors aligned in the front side of the substrate 2 so as to bypass the extended parts 7 of the modules 3.

In the fifth embodiment, the extended part 7 of the module 3 may be extended into the space between the substrate 2 and the base of the housing 10 (which the substrate 2 is fixed to) in the installation direction of the module 3.

According to the fifth embodiment, it is possible to effectively use the internal space of the housing 10, thus preventing an increase in the size of the housing 10. The fifth embodiment is able to mount numerous components 12 on the modules 3, connected to the connectors 5 of the substrate 2, without further increasing the size of the housing 10; hence, it is possible to realize a high-density server unit.

The present invention is not necessarily limited to the foregoing embodiments, which can be further modified within the scope of the invention as defined in the appended claims since the foregoing shapes and structures are illustrative and not restrictive. Thus, the present invention may embrace modifications and variations, which will be described below.

The foregoing embodiments refer to the bypass part 8 which is formed using a cutout running through the substrate 2 in the thickness direction so as to prevent the substrate 2 from contacting the extended part 7 of the module 3 or any components 12 mounted on the extended part 7. In this connection, the bypass part 8 may have any shape which does not block the extended part 7 from projecting in the installation direction of the module 3.

(1) First Variation

Figure 6:
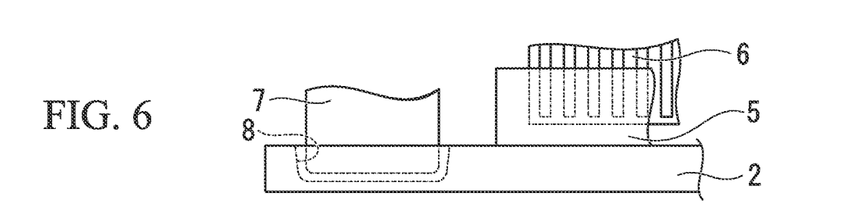
FIG. 6 is a side view partly in section showing a first variation with regard to a structure of a bypass part of a substrate.

FIG. 6 shows a first variation with regard to the structure of the bypass part 8 of the substrate 2. Herein, the bypass part 8 is a recess formed in the substrate 2. The recess serving as the bypass part 8 may allow the extended part 7 of the module 3, connected to the connector 5 of the substrate 2, to further project below the terminal 6 in the installation direction.

(2) Second Variation

Figure 7:
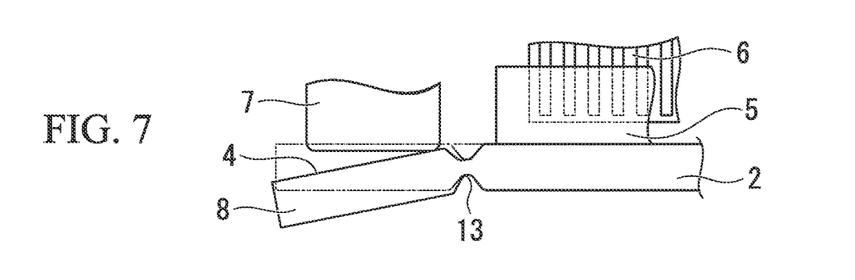
FIG. 7 is a side view partly in section showing a second variation with regard to a structure of a bypass part of a substrate.

FIG. 7 shows a second variation with regard to the structure of the bypass part 8 of the substrate 2. Herein, the bypass part 8 is equipped with an easy-to-bend part (or a flexible part) 12 which is formed in proximity to the connector 5. Compared to other parts of the substrate, the easy-to-bend part 13 can be bent with a small force in the installation direction. In this connection, the easy-to-bend part 13 may be subjected to elastic deformation or plastic deformation. The external part of the main face 4 of the substrate 2, positioned outside the easy-to-bend part 13, is pressed by the extended part 7 of the module 3 when the terminal 6 of the module 3 is connected to the connector 5.

The external part of the substrate 2, positioned outside the easy-to-bend part 13, is subjected to oscillatory movement about the easy-to-bend part 13, and therefore it is possible to prevent the extended part 7 of the module 3 from interfering with the engagement between the connector 5 and the terminal 6 by means of the bypass part 8. The second variation utilizes the easy-to-bend part 13; but this is not a restriction. It is possible not to use the easy-to-bend part 13 when the substrate 2 can be easily bent due to pressure of the extended part 7.

(3) Third Variation

Figure 8:
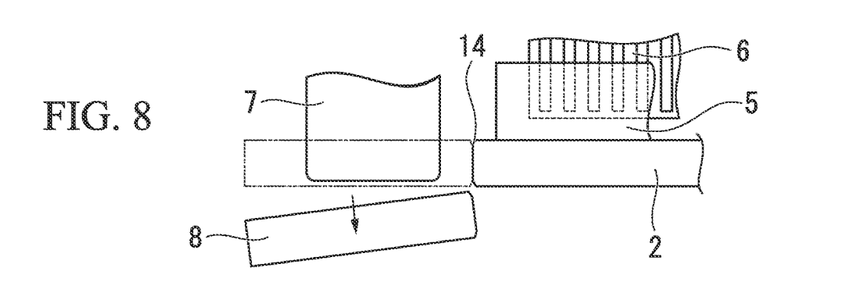
FIG. 8 is a side view partly in section showing a third variation with regard to a structure of a bypass part of a substrate.

FIG. 8 shows a third variation with regard to the structure of the bypass part 8 of the substrate 2. The third variation replaces the easy-to-bend part 13 with an easy-to-break part (or a fragile part) 14. The easy-to-break part 14 may be easily broken due to pressure applied to the external part of the main face 4 of the substrate 2 positioned outside the easy-to-break part 14. When the terminal 6 of the module 3 is connected to the connector 5 of the substrate 2, the extended part 7 of the module 3 presses the external part of the main face 4 of the substrate 2, positioned outside the easy-to-break part 14. Thus, the easy-to-break part 14 is broken while the external part of the substrate 2 is fallen away. Due to the separation of the external part of the substrate 2 positioned outside the easy-to-break part 14, it is possible to prevent the extended part 7 of the module 3 from interfering the engagement between the connector 5 and the terminal 6 by means of the bypass part 8.

(4) Fourth Variation

Figure 9:
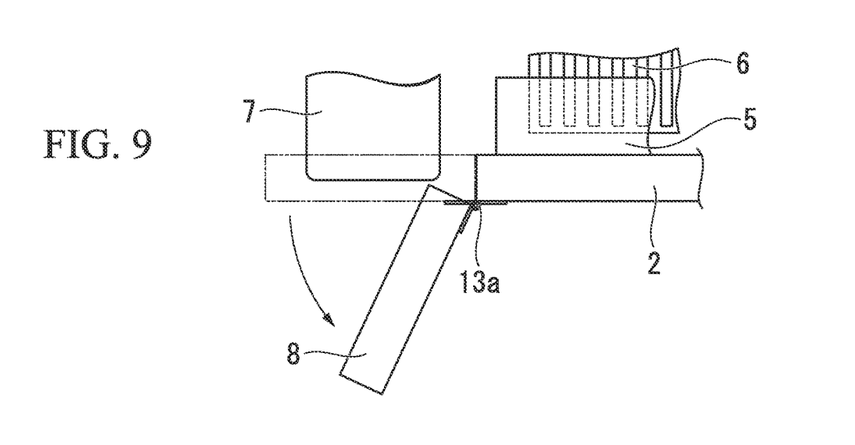
FIG. 9 is a side view partly in section showing a fourth variation with regard to a structure of a bypass part of a substrate.

FIG. 9 shows a fourth variation with regard to the structure of the bypass part 8 of the substrate 2. Herein, the bypass part 8 is equipped with a hinge 13a instead of the easy-to-bend part 13. When the terminal 6 of the module 3 is connected to the connector 5 of the substrate 2, the extended part 7 of the module 3 presses the bypass part 8, which in turn rotates about the hinge 13a so as to allow the extended part 7 to project below the terminal 6.

What is claimed is:

1. An electronic device comprising:
a substrate fixed to a housing and having a connector mounted on a main face thereof; and
a module having a terminal connectible to the connector and detachably attached to the connector,
wherein the module has an extended part projecting below the terminal in an installation direction with the connector of the substrate, wherein the substrate has a bypass part bypassing the extended part of the module, wherein, in an installed condition that the module is installed with the substrate by connecting the terminal with the connector, a bottom edge of the extended part of the module projects into a space formed between the substrate and a base of the housing in the installation direction, and wherein, in the installed condition, the bottom edge of the extended part of the module is disposed closer to the substrate rather than the base of the housing without contacting the base of the housing.

2. The electronic device according to claim 1, wherein the bypass part is formed in at least one of a front end and a rear end of the substrate.

3. The electronic device according to claim 1, wherein the bypass part comprises a cutout or a recess which is formed in the substrate and which has an adequate area allowing for insertion of the extended part of the module.

4. The electronic device according to claim 1, wherein the module having the extended part accommodates a plurality of components aligned in the installation direction, and wherein the extended part is extended from a lower end of the module by a difference between a first size, corresponding to multiple times size of each component, and a second size ranging from an upper end of the module to an end of the terminal.

5. A server including a housing keeping the electronic device according to claim 1.

6. The electronic device according to claim 1, wherein the module is disposed perpendicular to the substrate by connecting the connector of the substrate to the terminal of the module, and
wherein the module has an L-shape with the extended part which is formed by downwardly extending a part of the module, precluding the lower end of the module attached to the terminal, by a predetermined length below the lower end of the module.

7. The electronic device according to claim 1, wherein the module is disposed perpendicular to the substrate by connecting the connector of the substrate to the terminal of the module.

8. The electronic device according to claim 1, wherein the module has an L-shape with the extended part which is formed by downwardly extending a part of the module, precluding the lower end of the module attached to the terminal, by a predetermined length below the lower end of the module.

9. The electronic device of claim 1, wherein the bypass part comprises a recess portion in which the extended part extends therethrough when the module is combined with the substrate.

10. The electronic device of claim 1, wherein a height of the extended part is greater than a height of the terminal in the installation direction.

11. The electronic device of claim 1, wherein the extended part extends below the main face through the bypass part in the installation direction.

12. The electronic device of claim 1, wherein the module is vertically combined with the substrate via the connector while the extended part of the module is formed in association with the bypass part of the substrate.

13. The electronic device of claim 1, wherein the extended part is devoid of components.

14. The electronic device of claim 1, wherein the bypass part prevents the extended part of the module from overlapping the substrate.

* * * * *